United States Patent
Scaman

(12) 
(10) Patent No.: US 6,800,864 B2
(45) Date of Patent: Oct. 5, 2004

(54) METHOD AND STRUCTURE FOR REDUCING EFFECTS OF NOISE AND RESONANCE ASSOCIATED WITH AN E-BEAM LITHOGRAPHY TOOL

(75) Inventor: Michael Edward Scaman, Goshen, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/284,511

(22) Filed: Oct. 29, 2002

(65) Prior Publication Data

US 2004/0079901 A1 Apr. 29, 2004

(51) Int. Cl.⁷ .............................................. H01J 37/304
(52) U.S. Cl. .................. 250/492.22; 250/310; 250/311; 250/307; 250/306
(58) Field of Search ................................. 250/309, 310, 250/311, 307, 306, 292.22; 382/286

(56) References Cited

U.S. PATENT DOCUMENTS 5,591,971 A * 1/1997 Shahar et al. ............... 250/310
5,621,656 A * 4/1997 Langley ...................... 700/280

* cited by examiner

Primary Examiner—John R. Lee
Assistant Examiner—James J. Leybourne
(74) Attorney, Agent, or Firm—Jay H. Anderson

(57) ABSTRACT

An apparatus and method for reducing noise and resonance detractors connected with and E beam tool. The invention provides a plurality of embodiments. In one embodiment, the E beam tool will be calibrated and the results will be then filtered to counter the effects of the noise afterwards. In an alternate embodiment of the present invention, a filter is applied in the actual feedback of the E beam tool for the writing cycle.

6 Claims, 3 Drawing Sheets

ANALYSIS FOR COLLECT - NUMBER 9800 HEX 2648

COLLECT RESULTS: type=3 CNRXYtype=7 FAB  NEWEST TRANSMITTED RESULT DIAL

| PATTERN TYPE | TYPE = 7 FAB | | | | | | |
|---|---|---|---|---|---|---|---|
| COLLECT TYPE | TYPE = 3 CNRXY | | | | | | |
| LEARN QUALITY | FAILURE | | | | | | crit |
| TOOL ID | 0 | | | | | | EL |
| DEFLECTION NAME | EL5CLONE | | | | | | |
| LAST DEFLECTION | Learned | | | | | | |
| FEEDBACK LSB | 13.000000 | | | | | | |
| COLLECT NUMBER | 9800 | | | | | | |
| COLLECT DATE | 05/17/2002 | | | | | | |
| COLLECT TIME | 13:12:23 | | | | | | |
| | Raw Data: | TYPE/RANGE | X AXIS | QUALITY | Y AXIS | QUALITY | Go |
| | | std dev (nm) | 9.009 | | 4.112 | | |
| B CYCLE | | field avg | 0.048 | GOOD | -0.025 | GOOD | <= |
| | +- 25.00 nm | narrow rang | 0.025 | GOOD | 0.006 | GOOD | <= |
| | +- 100.00 nm | wide range | 0.000 | GOOD | 0.000 | GOOD | <= |
| | | missing | 0.000 | GOOD | 0.000 | GOOD | <= |
| STITCH DATA: | | [MICRONS] | | | [MICRONS] | | |
| | +- 7.00 nm | narrow rang | 0.003 | GOOD | 0.006 | GOOD | <= |
| | +- 22.00 nm | wide range | 0.000 | GOOD | 0.000 | GOOD | <= |

CANCEL / HIDE RESULTS

FIG. 5

METHOD AND STRUCTURE FOR REDUCING EFFECTS OF NOISE AND RESONANCE ASSOCIATED WITH AN E-BEAM LITHOGRAPHY TOOL

FIELD OF THE INVENTION

This invention relates generally to making of masks for semiconductor use and more particularly to calibration of an electron beam tool used in writing to a substrate.

BACKGROUND OF THE INVENTION

In today's fabrication of Integrated Circuits (IC) and other semiconductor devices, lithographic delineation procedures are used to yield positive or negative images to bring about selective processing, e.g. etching, implantation, diffusion, deposition, etc. This is especially true in fabrications of masks where the fabrication tool provides Blocking regions and Transparent regions which when illuminated by electron radiation yields an image defined by relatively low and high electron intensities, respectively. A Blocking region is usually defined as the mask region resulting in a degree of electron attenuation in the image which is of consequence in device fabrication. By contrast, a Transparent region is the mask region resulting in a degree of electron attenuation in the image which is small relative to blocking regions in terms of device fabrication. In the semiconductor industry, there is a continuing trend toward an increased device density. To achieve this, there is a continued effort towards the scaling down of device dimensions on semiconductor wafers. As smaller feature sizes become the new requirements (i.e. decreased width and spacing of interconnecting lines, etc.), new ways have to be utilized to achieve their manufacturing. High resolution lithographic processes are used as one of these manufacturing techniques to yield small component features.

In general, lithography refers to processes for pattern transfer between various media. In lithography for integrated circuit fabrication, a silicon slice, the wafer, is coated uniformly with a radiation-sensitive film, the resist. The film is then selectively exposed to radiation, such as optical light, x-rays, or an electron beam, through an intervening master template or the mask, forming a particular pattern. (In a mask, this leads to the creation of Blocking and Transparent regions which when illuminated by electron radiation yields an image defined by relatively low and high electron intensities, respectively.)

Most often exposed areas of the coating become either more or less soluble than the unexposed areas (depending on the type of coating) in a particular solvent developer. The more soluble areas are removed with the developer in a developing step, the less soluble areas remain on the silicon wafer forming a patterned coating. The pattern corresponds to the image of the mask or its negative. The patterned resist is used in further processing of the silicon wafer.

At various stages in forming the patterned resist coating and processing the silicon wafer, it is desirable to measure critical dimensions resulting from the lithographic process. Critical dimensions can include the size of features in the wafer or patterned resist such as line widths, line spacing, and contact dimensions. Several calibration methods are developed and can be used such as scanning electron microscopy (SEM) systems.

In such calibration system, because of the super fine structures to be calibrated, an electron beam is often scanned across the sample. The beam interacts with the sample to produce measurable responses that vary with position over the course of a scan. Although all such calibration systems measure critical dimensions with high precision, they must be calibrated frequently for the measurements to be accurate. Precise measurements are reproducible, but contain systematic errors that must be quantified and taken into account for the measurements to be accurate. Calibration quantifies systematic errors and is carried out on a regular basis.

Calibration involves taking measurements on a calibration standard. A calibration standard is a sample having accurately known dimensions. One calibration standard commonly employed is a periodic pattern formed into a silicon substrate. Another type of calibration standard is formed with a patterned polysilicon coating over a silicon wafer. A thin layer of silicon oxide is used to facilitate binding between the patterned polysilicon and the wafer. A similar calibration standard is formed with a uniform polysilicon coating over the silicon oxide layer and has a calibration patterned formed in another silicon oxide coating that is formed over the polysilicon. Other calibration standards are also used and are available.

A number of problems, however, still exists in the fabrication of masks and calibration of such devices using (E beam) tools. One of the biggest problems is the presence of detractors such as noise and frequency both in the calibration stage and the actual usage of the tool. Therefore, an improved structure and method is needed to eradicate or at least reduce the presence of such detractors in the calibration and usage of E beam tools in conjunction with the fabrication of semiconductor devices.

SUMMARY OF THE INVENTION

These and other objects are provided by the present invention for an apparatus and method for reducing noise and resonance detractors connected with an E beam tool. The invention provides a plurality of embodiments. In one embodiment, the E beam tool will be calibrated and the results will be then filtered to counter the effects of the noise afterwards. The corrections could be filtered by averaging the corrections over a subfield, and applying Fast Fourier Transform (FFT) to the set of averaged subfield corrections which will then be zero padded to the nearest power of 2. Knowing the frequency bands where the peaks may exist, the peaks can be removed in small neighborhood of each resonance or in a band of frequencies or both. Both linear and nonlinear filtering techniques may be used. An inverse FFT will then be performed (if FFT function applied originally) to adjust the corrections with the results.

In an alternate embodiment of the present invention, a filter is applied in the actual feedback of the E beam tool for the writing cycle. First the raw feedback data over each subfield is averaged and then the result is padded to nearest power of two. An FFT is then applied and the resonance or noise areas are removed by using a filter. The average feedback is then reconstructed through the application of an inverse FFT to adjust the corrections with the results. Again as before, both linear and nonlinear filters are equally applicable.

BRIEF DESCRIPTION OF THE DRAWINGS

FIG. 5, provides for resonance point improvements by illustrating standard deviations for X and Y exemplary results as provided in FIGS. 1–4.

DETAILED DESCRIPTION OF THE PREFERRED EMBODIMENTS

Figure 1:
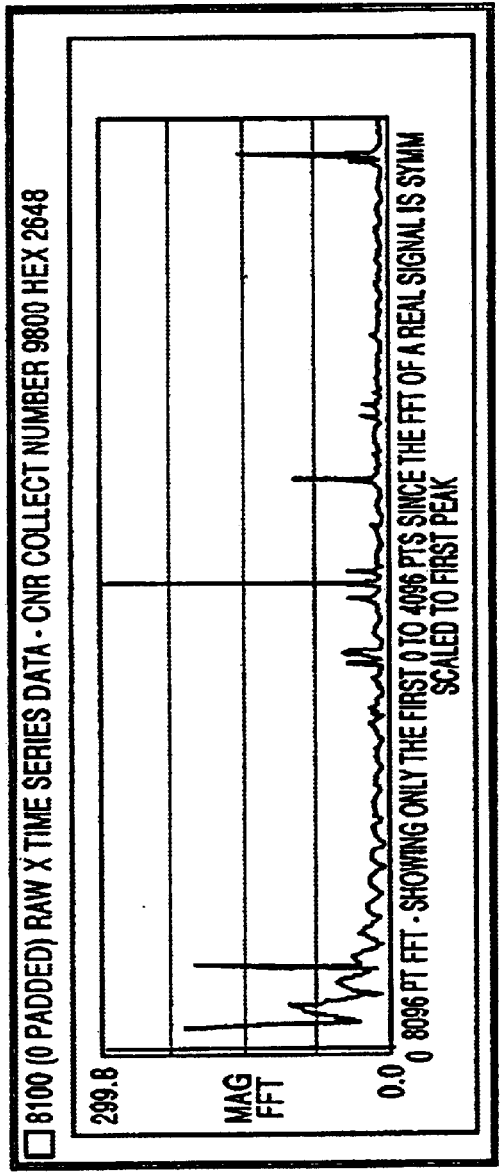
FIG. 1 is an illustration of exemplary results as per one embodiment of the present invention showing the FFT of the average feedback data/subfield(s) for a fine calibration collect for the write cycle for X.

One set of detractors for positional accuracy might be contributions of electrical noise from the environment or other sections of the tool such as mechanical resonance at lower frequencies. Other types of noises and resonance may also be present, in addition to the ones already mentioned, which will add to the problem. In order to the ensure the proper functioning of semiconductor devices, it is desirable to minimize any detracting noise and resonance present.

The problem in existence with many of the calibration approaches available today is the possibility that the E beam tool gets calibrated with the noise/resonance present. This in turn causes the noise/resonance sources to be present in the writing phase.

Even once the effects are minimized by redesign, one has to consider how these sources of detraction will affect the overall calibration of the tool. The tool generally has a course calibration for translation corrections for the writing field. It may also have a fine calibration for translation as well as a variety of other corrections such as magnification, rotation, trapezoidal and other positional components.

It is important to note that noise is a important consideration in battling these detractors. This is because not only noise is present during the calibration of the tool; it is also present during the actual usage of the tool. The aggregate amount of noise during these multiple usage can then have a great effect on the overall usability of the tool.

Once the pattern of noise is known, however (i.e. Such as in a band or specific frequencies) the noise can then be filtered out. To reduce the noise, two possible places can be used to apply a noise rejection filter. One is during the calibration of the tool and the second is after the normal calibration has been completed. The filter to be used may be linear or nonlinear.

As per one embodiment of the present invention, the E beam tool will be calibrated as it would normally be calibrated and the results will be then filtered to counter the effects of the noise afterwards. The corrections, particularly the translation corrections could be filtered by averaging the corrections over a subfield, and applying Fast Fourier Transform (FFT) to the set of averaged subfield corrections in the order the corrections were made (the scan order) and then zero padded to the nearest power of 2. Knowing the frequency bands where the peaks may exist, the peaks can be almost removed (nearly reduced to zero) in small neighborhood of each resonance, if resonance is the problem or in a band of frequencies is a problem or both, or by other conventional windowing filtering techniques. An inverse FFT will then be performed to adjust the corrections with the results. Although the method just described is more conducive to a linear filter approach, nonlinear filtering approaches are also possible and may be more adaptive to some situations. In such cases, the bands of frequencies are identified where there may be noise or resonance and then a median filter is applied. As a consequence, the peaks are removed while preserving the frequency structure of the signals.

In an alternate embodiment of the present invention, a filter is applied in the actual feedback of the E beam tool for the writing cycle in the same manner as previously stated. First the raw feedback data over each subfield is averaged and then the result is padded to nearest power of two. An FFT is then applied and the resonance or noise areas are removed by zeroing and/or filtering techniques such as conventional windowing filters known to those skilled in the art. (Knowing the frequency bands where the peaks may exist, the peaks can be in small neighborhood of each resonance, if resonance is the problem or in a band of frequencies is a problem or both.) The average feedback is then reconstructed through the application of an inverse FFT to adjust the corrections with the results. Again as before, although the method just described is more conducive to a linear filter approach, nonlinear filtering approaches are also possible and may be more adaptive to some situations. The bands of frequencies can be identified where there may be noise or resonance and a median filter is then added to counter the problem. This technique will take out the peaks while preserving the frequency structure of the signals in most.

Figure 2:
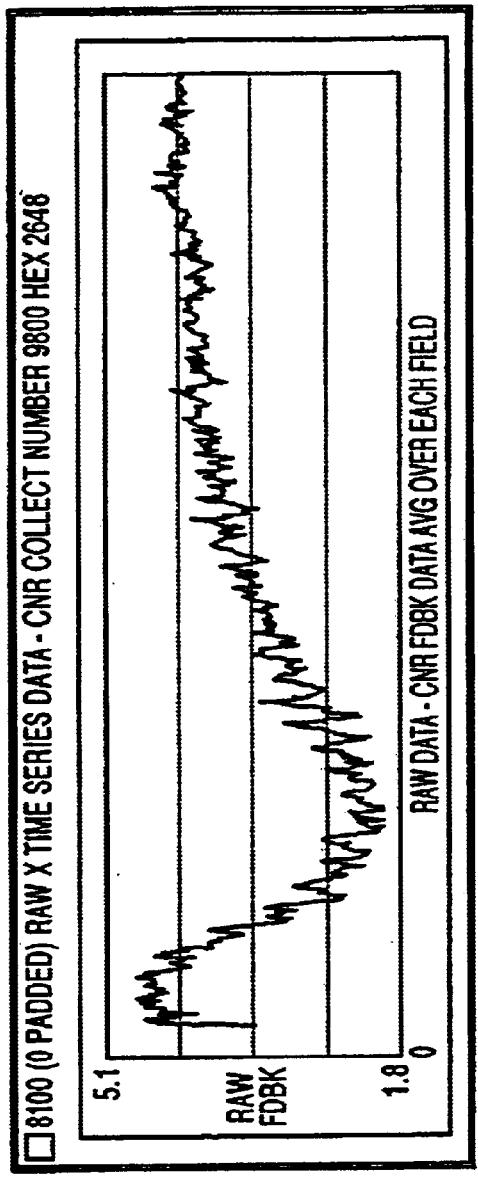
FIG. 2 provides for the raw time series data for the results provided in FIG. 1 as per one embodiment of the present invention.
Figure 3:
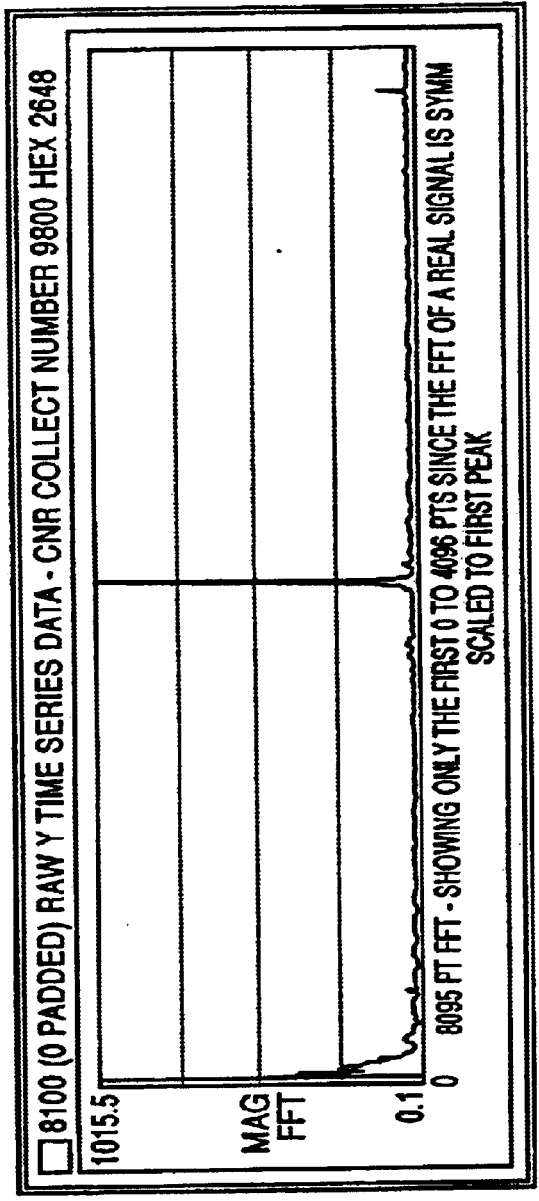
FIG. 3 is an illustration of exemplary results as per an alternate embodiment of the present invention showing the FFT of the average feedback data/subfield(s) for a fine calibration collect for the write cycle for Y.
Figure 4:
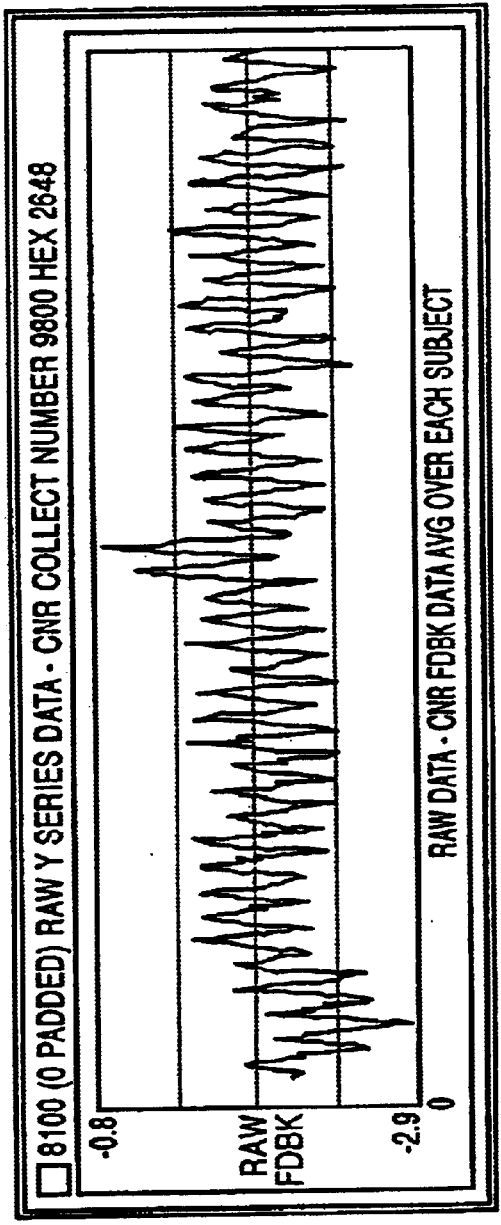
FIG. 4 provides for the raw time series data for the results provided in FIG. 3 as per an alternate embodiment of the present invention.

As an example the FFT of the average feedback data/subfield is shown in FIG. 1 for a fine calibration collect for the write cycle for the X and the raw time series data is also attached as shown in FIG. 2. A similar example for Y is shown in FIG. 3 and the associated raw time series data is also attached in FIG. 4. In the X and Y samples shown in FIGS. 1–4, the quality of the collect used was fairly good having a 9 nm standard deviation in X and 4 nm standard deviation in Y. Nonetheless, as shown in FIG. 5, with even such good results the FFT's indicated leave a lot of resonance points which are opportunities for improvement.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of reducing effects of noise and resonance detractors in an electron beam tool, comprising the steps of:
   calibrating said electron beam tool by making measurements over a writing field using said tool of dimensions on a standard having known dimensions;
   determining form results of said calibrating step a noise pattern due to the noise and resonance detractors;
   determining calibration corrections to be made in accordance with said noise pattern;
   averaging said corrections over a subfield;
   applying a Fast Fourier Transform (FFT) to said averaged corrections and zero padding results of the FFT to a nearest power of two, the FFT being applied in the order in which corrections were made, said order being a scan order;
   determining from said noise pattern frequency peaks and resonance where peaks may exist requiring correction;
   filtering all determined peaks in a neighborhood of each resonance and band of frequencies so that such peaks are removed and;
   performing an inverse Fast Fourier transform after said filtering step to adjust said correction.

2. The method of claim 1, wherein linear filters are used.

3. The method of claim 2, wherein windowing filtering techniques are used.

4. The method of claim 1, wherein nonlinear filtering techniques are used.

5. The method of claim 4, wherein bands of frequencies are identified where there may be noise or resonance and then a median filter is applied.

6. The method of claim 5, wherein said median filter is applied in a manner as to remove peaks while preserving frequency structure of signals.

* * * * *